United States Patent
Wang et al.

(10) Patent No.: US 10,481,210 B2
(45) Date of Patent: Nov. 19, 2019

(54) METHODS TO DETERMINE BATTERY CELL VOLTAGE RELAXATION TIME BASED ON CELL USAGE HISTORY AND TEMPERATURE

(71) Applicant: FORD GLOBAL TECHNOLOGIES, LLC, Dearborn, MI (US)

(72) Inventors: Xu Wang, Dearborn, MI (US); Xiaoguang Chang, Northville, MI (US); Chuan He, Northville, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 1349 days.

(21) Appl. No.: 14/330,458

(22) Filed: Jul. 14, 2014

(65) Prior Publication Data
US 2016/0011269 A1    Jan. 14, 2016

(51) Int. Cl.
*G01R 31/367* (2019.01)
*G01R 31/3835* (2019.01)

(52) U.S. Cl.
CPC ....... *G01R 31/367* (2019.01); *G01R 31/3835* (2019.01)

(58) Field of Classification Search
CPC .......................... G01R 31/3651; G01R 31/367
USPC ........................................................ 702/63
See application file for complete search history.

(56) References Cited

U.S. PATENT DOCUMENTS

| | | |
|---|---|---|
| 6,495,989 B1 | 12/2002 | Eguchi |
| 7,453,238 B2 | 11/2008 | Melichar |
| 7,466,138 B2 | 12/2008 | Cho |
| 7,554,295 B2 | 6/2009 | Melichar |
| 8,089,248 B2 | 1/2012 | Tabatowski-Bush |
| 8,207,706 B2 | 6/2012 | Ishikawa |
| 8,207,740 B2 | 6/2012 | Lin |
| 8,274,291 B2 | 9/2012 | Tsuchiya |
| 8,543,272 B2 | 9/2013 | Yu |
| 8,560,153 B2 | 10/2013 | Nefcy |
| 8,589,097 B2 | 11/2013 | Kirchev |
| 8,706,333 B2 | 4/2014 | Li |
| 8,736,224 B2 | 5/2014 | Gale |
| 2004/0128089 A1* | 7/2004 | Barsoukov ......... G01R 31/3662 702/65 |
| 2006/0244458 A1* | 11/2006 | Cho ..................... B60L 11/1861 324/426 |
| 2009/0140697 A1* | 6/2009 | Hurley .................. H02J 7/0091 320/139 |
| 2011/0048823 A1* | 3/2011 | Connolly ................. B60K 6/48 180/65.29 |
| 2011/0285356 A1* | 11/2011 | Maluf ................... H02J 7/0052 320/139 |
| 2011/0309838 A1 | 12/2011 | Lin |

(Continued)

FOREIGN PATENT DOCUMENTS

EP         0225364 A1    12/1986

*Primary Examiner* — Ricky Ngon
(74) *Attorney, Agent, or Firm* — David B. Kelley; MacMillan, Sobanski & Todd, LLC

(57) ABSTRACT

Lithium ion battery state of charge (SOC) is a function of open circuit voltage (OCV). Battery internal diffusion process needs to be nearly completed to be able to measure battery open circuit voltage. The length of the minimum settling time depends on the battery type, usage and temperature. Described are methods to determine electric vehicle battery voltage relaxation time based on battery temperature and usage history.

4 Claims, 8 Drawing Sheets

(56) References Cited

U.S. PATENT DOCUMENTS

2014/0058595 A1    2/2014  Li
2014/0070606 A1    3/2014  Gibeau
2014/0236511 A1*   8/2014  Kulkarni .............. G01R 31/362
                                                         702/63

* cited by examiner

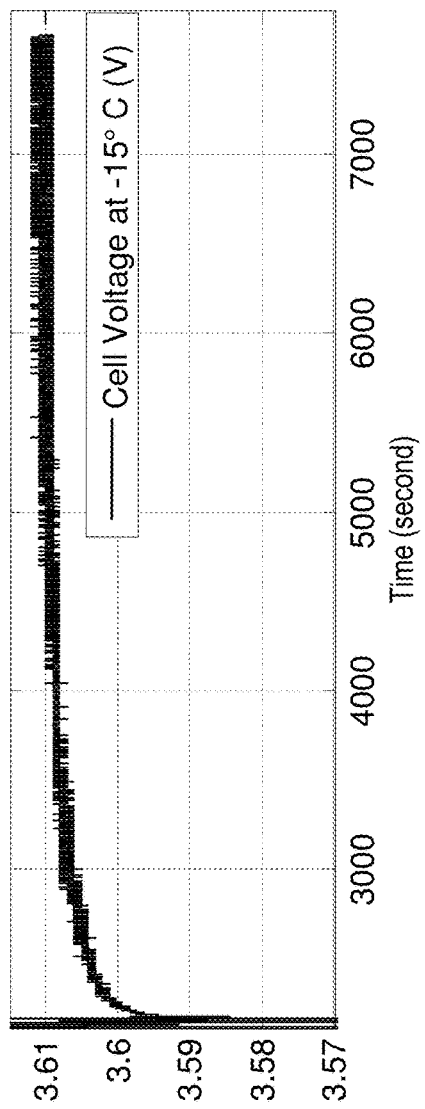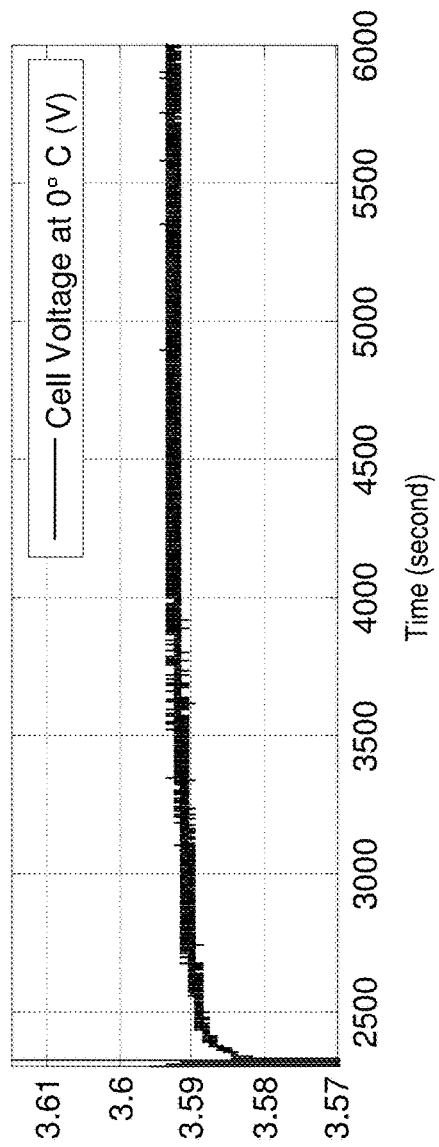

METHODS TO DETERMINE BATTERY CELL VOLTAGE RELAXATION TIME BASED ON CELL USAGE HISTORY AND TEMPERATURE

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to batteries, and, more specifically, to a method and system for determining the relaxation time of a battery cell in an automobile battery in an electric vehicle.

The term "electric vehicle," includes vehicles having an electric motor for vehicle propulsion, such as battery electric vehicles (BEV), hybrid electric vehicles (HEV), and plug-in hybrid electric vehicles (PHEV). A BEV includes an electric motor, wherein the energy source for the motor is a battery that is re-chargeable from an external electric source, such as a power grid. In a BEV, the battery is the source of energy for vehicle propulsion. A HEV includes an internal combustion engine and an electric motor. The energy source for the HEV engine is fuel and the energy source for the motor is a battery. In a HEV, the engine is the main source of energy for vehicle propulsion with the battery providing supplemental energy for vehicle propulsion. The HEV battery buffers fuel energy usage and stores recovered kinetic energy, such as from regenerative braking. A PHEV is like a HEV, but the PHEV has a larger capacity battery that is rechargeable from the external electric grid. In a PHEV, the battery is the main source of energy for vehicle propulsion until the battery depletes to a low energy level, at which time the PHEV operates like a HEV for vehicle propulsion. The electric vehicle monitors the status of the battery using a number of measurements and estimations, including battery state of charge (SOC). An accurate estimate of SOC is needed in the electric vehicle for several purposes, including proper power management and reliable reporting of remaining driving range to the driver.

U.S. Pat. No. 8,706,333, issued Apr. 22, 2014, and U.S. Patent Application Publication 2014/0058595, published Feb. 27, 2014, describe methods and systems for determining battery state of charge and are hereby incorporated by reference.

Lithium ion battery open circuit voltage (OCV) is a good indicator for battery SOC. SOC can be estimated as long as a high quality OCV can be obtained. When using battery terminal voltage as battery OCV, for an accurate SOC estimation, the battery internal diffusion process must complete or nearly complete. If the battery terminal voltage has relaxed for a sufficient time period from the last battery usage, the battery terminal voltage provides a basis for accurate SOC estimation. In contrast, for example, if battery terminal voltage is measured immediately after discharging, SOC can be substantially underestimated. Similarly, SOC can be overestimated when battery terminal voltage is measured immediately after charging.

At power up (i.e., starting a new drive cycle), if the battery voltage has not had sufficient time to relax, a SOC estimate based on the unrelaxed OCV is inaccurate and differs substantially from the most recent SOC estimation obtained during the last drive period. To avoid making an inaccurate SOC estimate, current methods employ fixed waiting times after power off before allowing SOC-OCV adjustment at power up. However, there are drawbacks to using a fixed waiting time. For example, battery voltage may need less time to relax, and if a vehicle is turned on before the preset time elapses from the last drive period, then the battery controller will miss an opportunity to accurately update the SOC value. As another example, preset time periods may be insufficient for voltage relaxation, particularly in conditions at low temperature and heavy battery usage.

SUMMARY OF THE INVENTION

The present invention provides methods for estimating a battery cell voltage relaxation time, employing temperature and cell usage history to achieve increased accuracy.

In one aspect of the invention, methods of estimating battery cell relaxation time in an electric vehicle comprise measuring a battery temperature; measuring a first voltage of the battery at a first time; measuring a second voltage of the battery at a second time; calculating a current RMS value based on battery current measurement between the first voltage measurement and the second voltage measurement; recording the current RMS value; and determining a minimum relaxation time based on the current RMS value and temperature.

In a further aspect of the invention, an electric vehicle with a battery controller comprises a system for SOC-OCV adjustment, wherein the performance of the SOC-OCV adjustment at power up is performed if the battery relaxation is adequate, as determined by a calculated relaxation time based on usage history and temperature.

BRIEF DESCRIPTION OF THE DRAWINGS

FIG. 8 is a graph showing cell voltage during drive cycle pack testing at −15° C.

FIG. 9 is a graph showing cell voltage during drive cycle pack testing at 0° C.

DETAILED DESCRIPTION OF PREFERRED EMBODIMENTS

Figure 1:
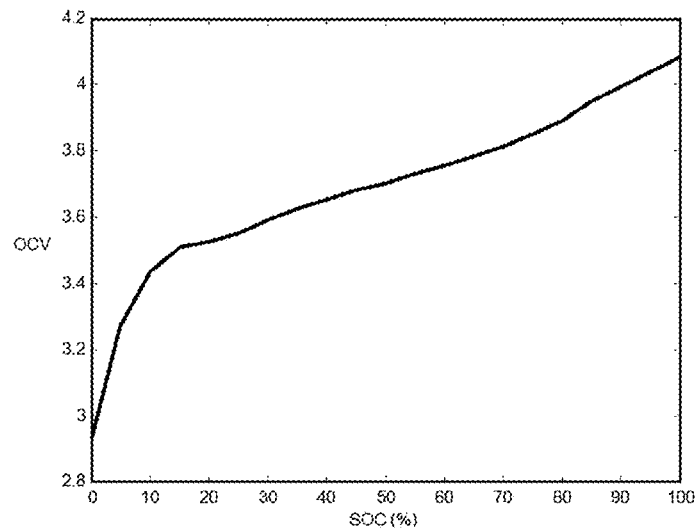
FIG. 1 is an example of a Lithium ion cell SOC-OCV curve at a stable temperature.

FIG. 1 shows an example of a Lithium ion cell SOC-OCV curve at a stable temperature. Due to the one-to-one mapping between OCV and SOC, SOC can be estimated if a high quality OCV can be obtained. In a Battery Energy Control Module (BECM), cell SOC-OCV curves can be saved as a look up table (LUT) of temperature, SOC, and cell voltage. For example, within typical PHEV battery SOC operation range (e.g. PHEV 100% SOC to 10% SOC), about 3 mV cell voltage corresponds to 1% SOC. The preferred criterion for sufficient cell voltage relaxation is when cell voltage relaxes to within 3 mV of its steady state value. In some embodiments, valid OCV measurement may be obtained when the cell voltage relaxes to within 0-3 mV of its steady state value, 0-5 mV of its steady state value, or 0-10 mV of its steady state value.

Figure 2:
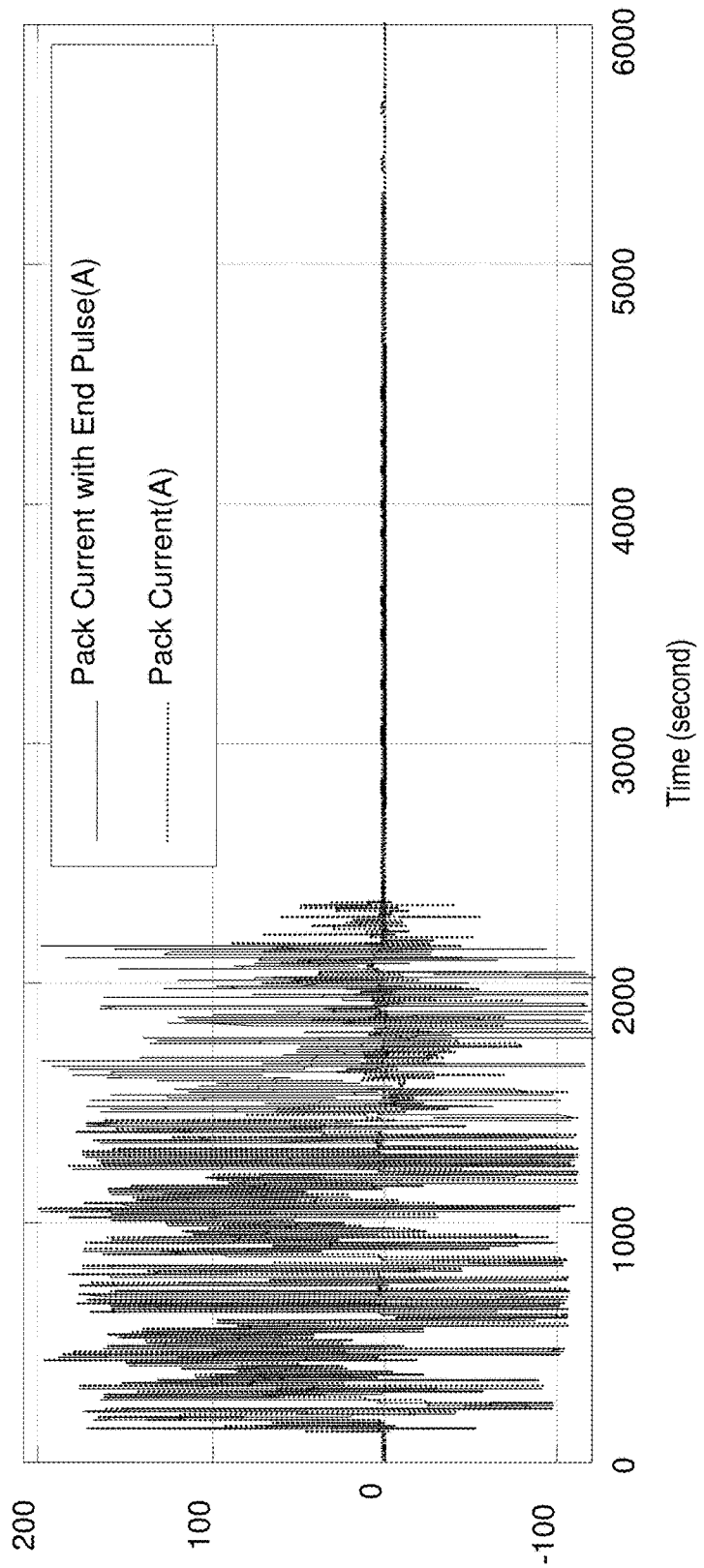
FIG. 2 is a graph showing drive cycle pack testing at 0° C. showing current over time.
Figure 3:
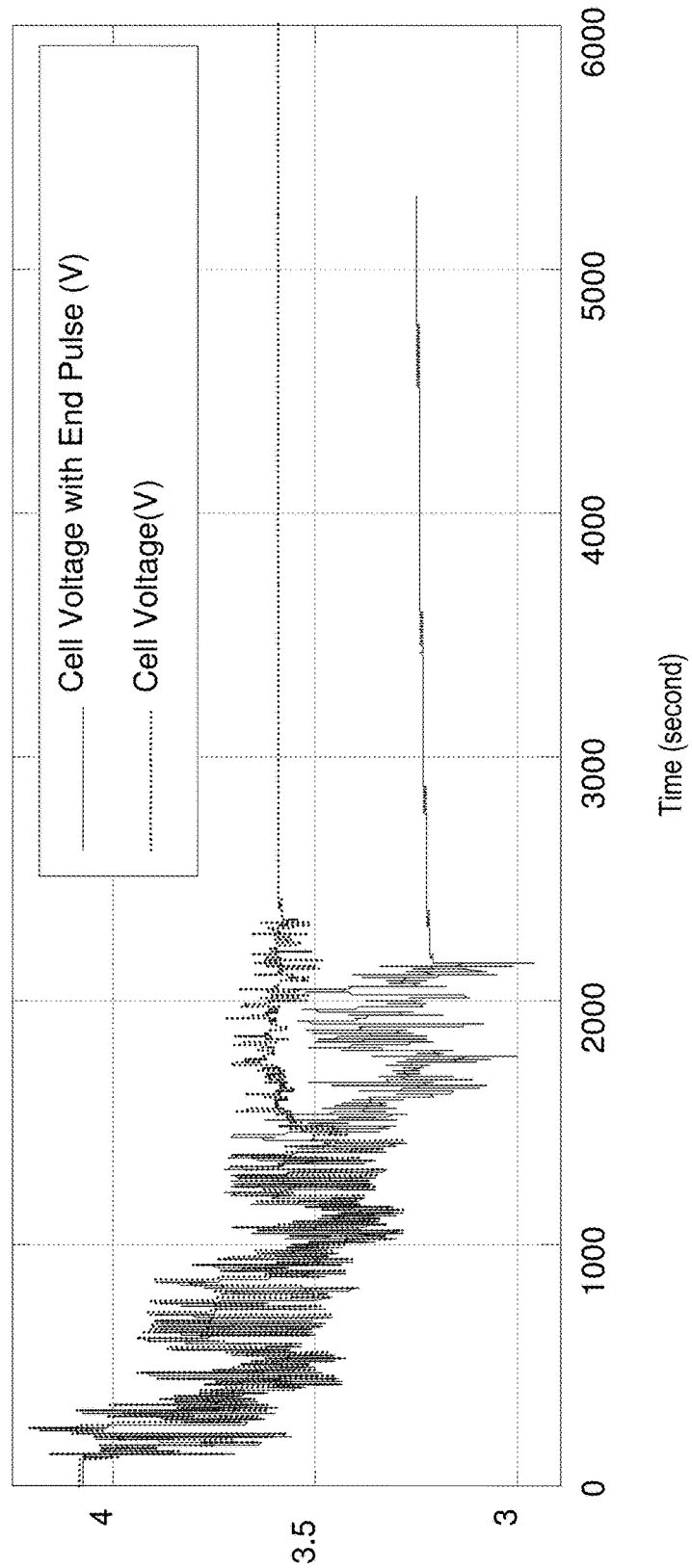
FIG. 3 is a graph showing drive cycle pack testing at 0° C. showing cell voltage over time.

In order to characterize the factors that affect relaxation time, battery cells were tested at various temperature and usage conditions. FIG. 2 and FIG. 3 show pack current and one cell voltage of the PHEV US06 drive cycle pack testing at 0° C. and −15° C. respectively. In the plots, the notation 'Pack Current with End Pulse' indicates that there is heavy usage of battery, such as a large discharge or charge pack current, before opening battery contactors.

Cell voltage measurements were compared at the same temperature, testing with and without heavy end usage of the battery. Heavy battery usage immediately preceding power down resulted in longer time periods needed for the cell voltage to relax.

For example, from the testing data at 0° C. shown by FIG. 2 and FIG. 3, the steady state value of cell voltage is about 3.251V with heavy battery end usage, and 3.593V without heavy battery end usage. From opening the contactors, it took about 2477 seconds, or more than 40 minutes, for cell voltage relaxing to 3.248V in the heavy battery end usage case. In contrast, the cell required only about 388 seconds, or just over 6 minutes, for cell voltage relaxing to 3.590V in the absence of heavy battery end usage.

Figure 4:
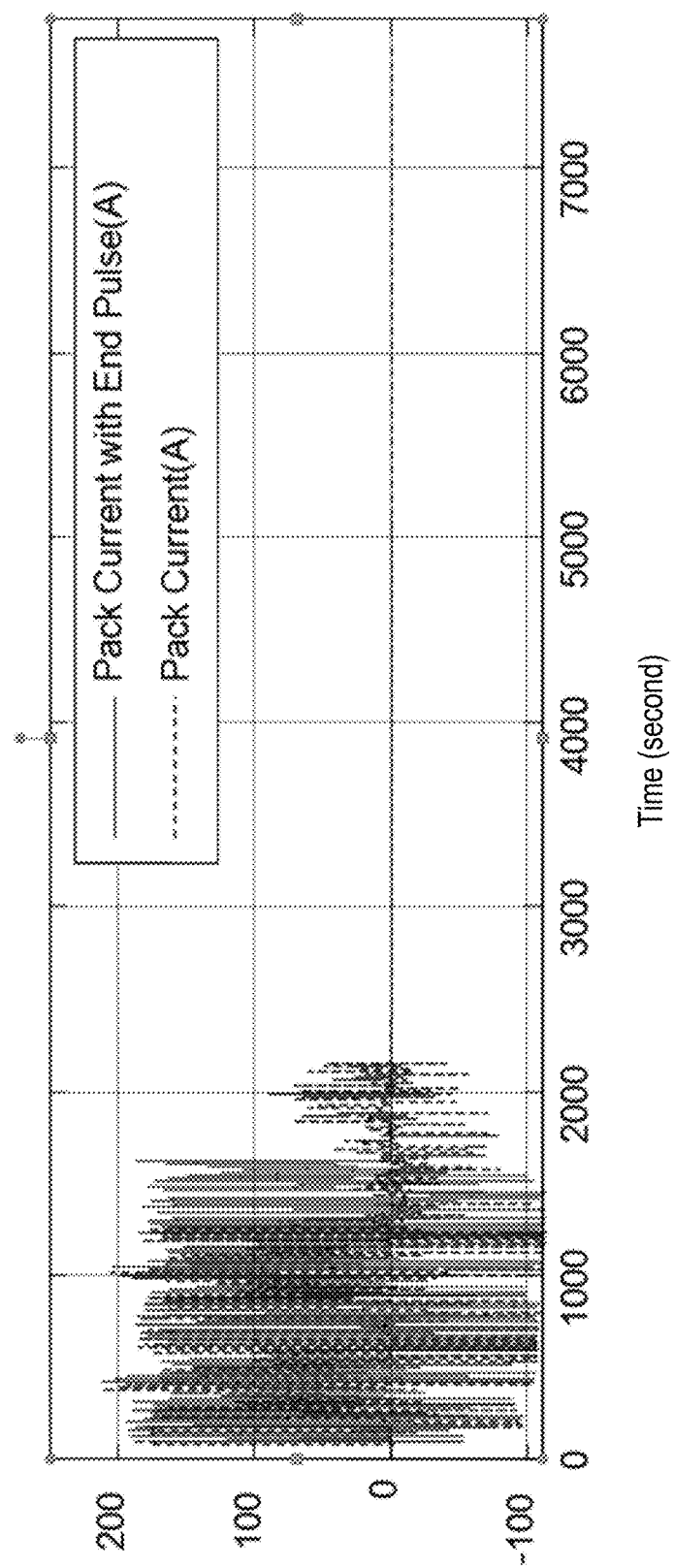
FIG. 4 is a graph showing drive cycle pack testing at −15° C. showing current over time.
Figure 5:
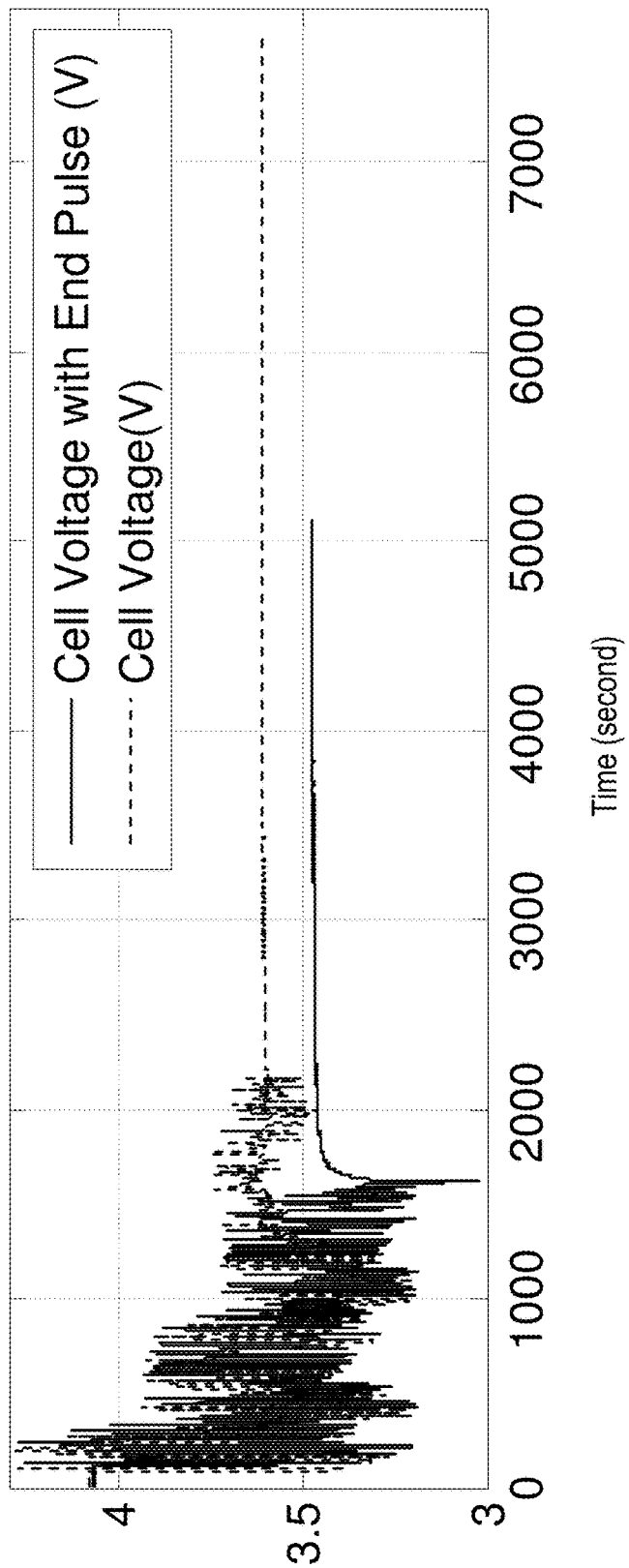
FIG. 5 is a graph showing drive cycle pack testing at −15° C. showing cell voltage over time.

Similarly, from the testing data at −15° C. shown by FIG. 4 and FIG. 5, the steady state value of cell voltage is about 3.474V with heavy battery end usage, and 3.610V without heavy battery end usage. From opening the contactors, it took about 1761 seconds, or nearly 30 minutes, for cell voltage relaxing to 3.471V with heavy battery end usage. While the cell required only about 930 seconds, or approximately 15 minutes, for cell voltage relaxing to 3.607V in the absence of heavy battery end usage.

Figure 6:
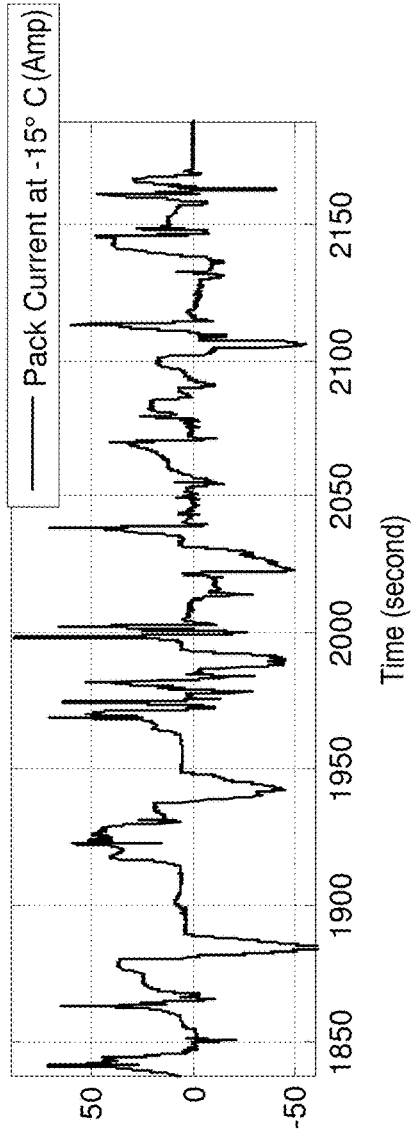
FIG. 6 is a graph showing current profile during drive cycle pack testing at −15° C.
Figure 7:
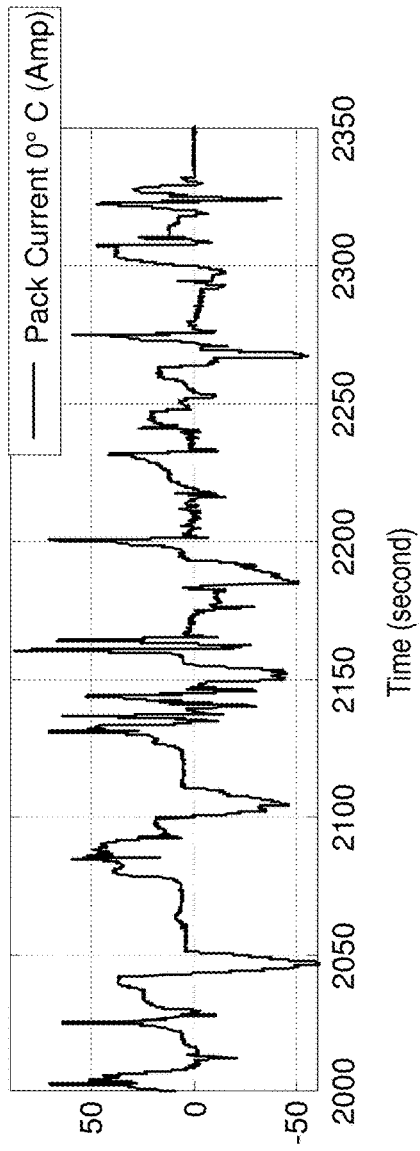
FIG. 7 is a graph showing current profile during drive cycle pack testing at 0° C.

FIGS. 6 and 7 correspond to current consumption during substantially identical drive cycles at different temperatures. More specifically, FIG. 6 shows the zoomed-in battery testing in the absence of heavy end usage at 0° C., and FIG. 7 shows the same usage at −15° C. The two current profiles are almost the same, indicating that the battery has the same usage at different temperatures. From the zoomed-in cell voltage in FIG. 8, at −15° C., cell voltage needs about 930 seconds to relax. In contrast, the cell voltage relaxing time at 0° C. shown in FIG. 9 is much shorter, in this instance approximately 388 seconds. The data shows that longer cell voltage relaxation times are needed at lower battery temperatures.

In some embodiments, under conditions of low temperature and/or under conditions of heavy battery usage, including charge and discharge events, sufficient relaxation time may be 15-60 minutes, 20-50 minutes, 30-50 minutes, 40-60 minutes, or 45-60 minutes. In some embodiments, under conditions of high temperature and/or light battery usage, sufficient relaxation time may be 0-15 minutes, 0-10 minutes, 5-15 minutes, 5-10 minutes, 0-5 minutes, 0-3 minutes, less than one minute, or approximately 30 seconds.

Cell voltage relaxation time determination methods based on battery temperature and usage history are used in the present invention to delineate appropriate waiting periods for measuring OCV data points to be used for calculating SOC. Embodiments of the invention provide an alternative to using a fixed, constant time period for determining when to measure OCV.

Battery pack current Root Mean Square (RMS) value is a preferred indicator for battery usage. Other types of averaging or integration can alternatively be used to characterize usage, such as a moving average or mean. In the preferred embodiment using battery pack current RMS value to represent battery usage, a time window width for determining RMS current can be 1 or 2 seconds, or another calibrated value which can be determined from offline testing. For example, using pack current sampled at a 2 ms or 10 ms rate, the following approximation method can be used to calculate battery RMS current:

Measure the pack current at a 10 ms rate for a predetermined period (e.g., for between 1 and 5 seconds).

Update the RMS value at each time step k as follows:

$$PackCurrent\_RMS(k) = \sqrt{\frac{PackCurrent\_RMS(k-1)^2 * 9 + PackCurrent(k)^2}{10}}$$

The RMS current value is proportional to usage of the battery.

As an example, a large RMS current value indicative of heavy usage in many automotive batteries may include values of approximately 90 amps, 85-95 amps, 70-100 amps, over about 80 amps, or over about 70 amps (depending on the size of the battery or traction motor). For example, an electric vehicle carrying four passengers up a steep driveway might induce a pack current of about 120 A during the measured time period, which could be represented as an RMS current value of approximately 110 A. A small RMS current value would include values of approximately 5 amps, 0-10 amps, 0-15 amps, 1-7 amps, or less than 3 amps. For example, an electric vehicle, carrying little weight and coming to rest after driving on a flat road or mild downslope, might induce a pack current of about 78 A during the measured time period, which could be represented as an RMS current value of approximately 50 A. The detected usage that occurs just before turning off of the electric drive by opening the battery contactor switches is an indication of the likely duration of the relaxation time.

The required relaxation times in the LUT can be obtained from the offline testing of a particular battery type at different temperatures and battery usage. The testing can be designed in the way described in the following procedure: 1) soak battery to the target temperature, for example −40° C.; 2) apply a certain level charge/discharge current to battery (for example 20A) for certain time window width (for example 2 seconds); 3) assess the cell voltage relax time by using the criterion that cell voltage relaxes within 3 mV of its steady value; 4) repeat steps 1)-3) for a set of variable conditions with regard to temperatures, current levels and time window width; 5) for a certain temperature and current level, use the largest of the charge current relax time and discharge relax time from different time window width as the required relax time in the LUT.

A look up table (LUT) in terms of battery RMS current and battery temperature may be used for battery cell voltage relaxation time determination. The RMS current and battery temperature are calculated or measured at or just before beginning to power down. The following table provides an example.

TABLE 1

PHEV Battery Cell Voltage Relaxation Time Example (in Minutes)

| RMS Current (A) | Temp (° C.) | | | | |
|---|---|---|---|---|---|
| | −40 | −30 | ... | 50 | 60 |
| 3 | 5 | 3 | ... | 0.5 | 0.5 |
| 6 | 10 | 8 | ... | 0.5 | 0.5 |
| ... | ... | ... | ... | ... | ... |
| 90 | 40 | 30 | ... | 5 | 5 |

This LUT can be used at power down and the results from reading the LUT can be saved for use during startup in non-volatile memory, such as in electrically erasable programmable read-only memory (EEPROM). In some embodiments, the saved reading is then used at next power up to decide whether the power off time is adequate for obtaining a good SOC OCV estimate.

The act of looking up the appropriate wait time from LUT can alternatively be performed at power up by recording the battery temperature and RMS current values in the EEPROM during the previous power down for use as the LUT inputs. From the LUT output, the power off time can be judged as to whether it is long enough for a good cell voltage relaxation.

The LUT reading methods can be performed using a linear interpolation method. For example, at −30° C., for a 4 A RMS current, the required relax time is about 4.67 minutes by linear interpolation (4.67 minutes≈3 minutes+(8 minutes−3 minutes)*(4 A−3 A)/(4 A−3 A)) from Table 1. In some embodiments, The LUT reading methods can be performed using a nonlinear interpolation methods, such as polynomial interpolation, spline interpolation.

The LUT reading methods can also be performed using an end-value method. This method does not interpolate or extrapolate. Instead, the element in RMS current nearest and above the input RMS current is found and the element in temperature nearest and below the input temperature is found. The corresponding element in the relaxation time is then used as the output. For example, at −29° C., for a 4 A RMS current, the required relax time is 8 minutes by using the high-end value of RMS current at 6 A RMS and the low-end value of temperature at −30° C. from Table 1.

Besides the methods of LUT, data fitting methods can be used to represent the relationship between relax time, battery temperature and battery usage RMS current. From the offline testing raw data, data fitting can construct a mathematical function of relax time in terms of battery temperature and RMS current:

Time_relax=$f$(temperature,RMS current)

When battery temperature and RMS current are available, required battery relax time can be calculated from this function. An example of data-fitting method is the neural network.

Figure 10:
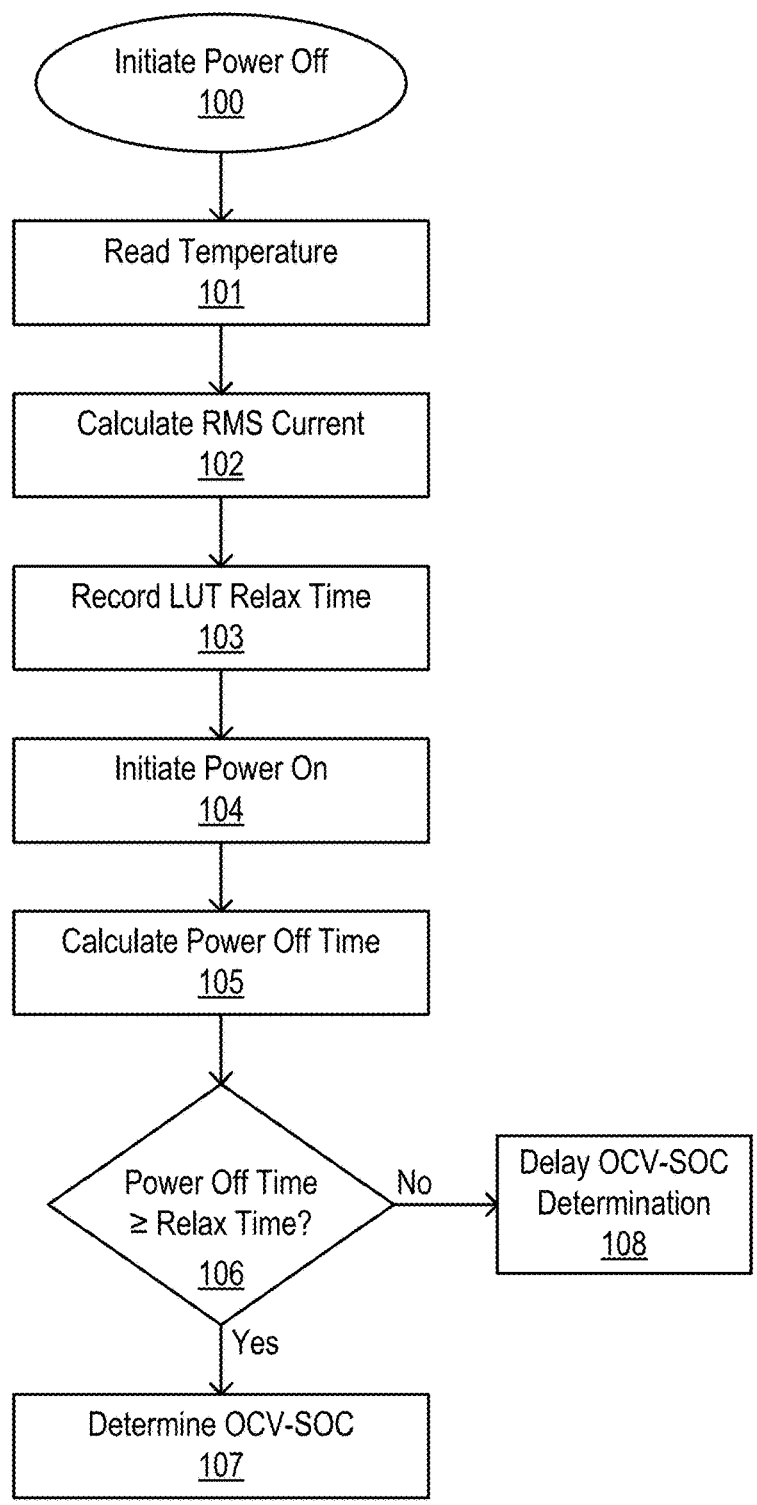
FIG. 10 is a flow chart of a method of implementing the invention in SOC determination.

FIG. 10 shows a flow chart of a method of implementing the invention in SOC determination. A user initiates a power off in step 100. A temperature reading is measured in step 101. A RMS current is calculated in step 102. A relax time is determined using the LUT and is recorded in step 103 to EEPROM or other memory. A user initiates power on in step 104. The power off time is determined in step 105. The power off time is compared to the previously determined battery cell relaxation time in step 106. If relax time is less than or equal to the actual power off time, OCV is used to determine SOC in step 107. The SOC may then be displayed to a user and used in subsequent battery monitoring and control. If the relax time from the LUT is greater than the actual power off time, then an alternate SOC estimation is used or the OCV reading and determination of SOC is delayed in step 108.

Figure 11:
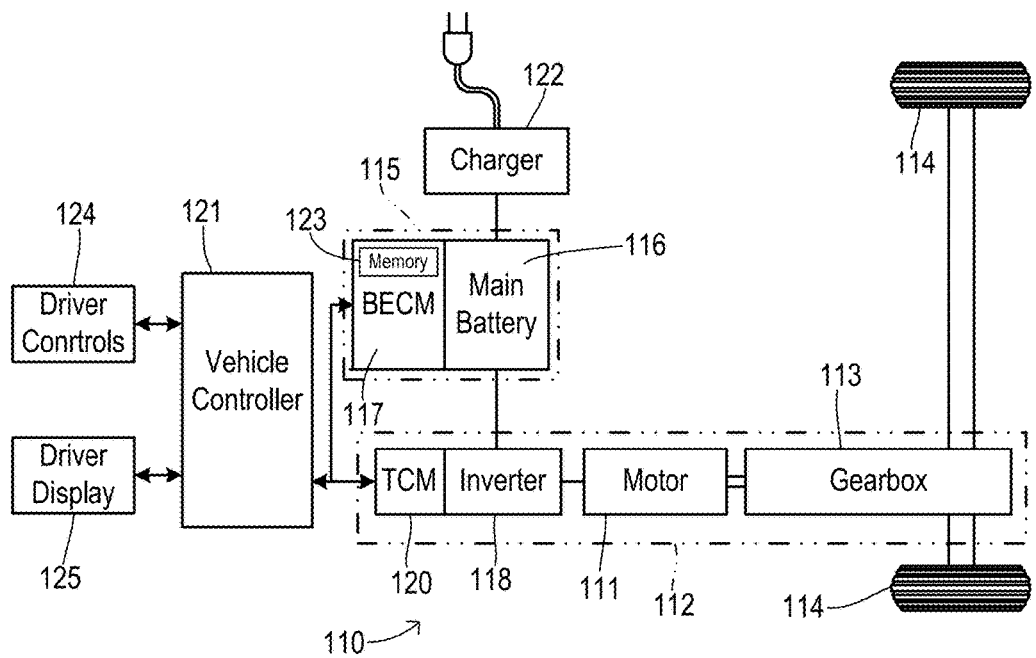
FIG. 11 is a diagram of an electric vehicle system with an embodiment of the present invention.

FIG. 11 shows a diagram of an electric vehicle with a system using the described methods. By way of example, FIG. 11 depicts a vehicle 110 as a battery electric vehicle (BEV) propelled by an electric motor 111 without assistance from an internal combustion engine. Motor 111 receives electrical power and provides drive torque for vehicle propulsion. Motor 111 also functions as a generator for converting mechanical power into electrical power through regenerative braking. Motor 111 is part of a powertrain 112 in which a gearbox 113 couples motor 111 to driven wheels 114.

Vehicle 110 includes a battery system 115 including a main battery pack 116 and a battery energy controller module (BECM) 117. An output of battery pack 116 is connected to an inverter 118 which converts the direct current (DC) power supplied by the battery to alternating current (AC) power for operating motor 111 in accordance with commands from a traction control module (TCM) 120. TCM 120 monitors, among other things, the position, speed, and power consumption of motor 111 and provides output signals corresponding to this information to other vehicle systems including a main vehicle controller 121 (which may be a powertrain control module, or PCM, for example).

An AC charger 122 is provided for charging main battery 116 from an external power supply (not shown), such as the AC power grid. Although vehicle 110 is shown as a BEV, the present invention is applicable to any electric vehicles using a multi-cell battery pack including HEVs and PHEVs. In the embodiment shown, the BECM 117 includes at least one component for memory 123 which stores one or more LUTs, temperatures, times, and usage history data. The driver controls 124 provide input to the vehicle controller 121, including turning the vehicle on and off. The vehicle controller 121 provides vehicle status information to the driver display 125, including battery charge information.

Described adaptive cell voltage relaxation time determination methods, based on battery temperature and usage, provide assurance that OCV-based SOC is calculated from a sufficiently relaxed cell voltage. This improves SOC accuracy under a wide range of driving conditions, including extreme temperatures and heavy battery load preceding power down, by identifying the minimal the wait time for obtaining a valid OCV measurement.

The terms and expressions which have been employed are used as terms of description and not of limitation. Whenever a range is given in the specification, all intermediate ranges and subranges, as well as all individual values included in the ranges given are intended to be included in the disclosure. It should be understood that, although the present invention has been specifically disclosed by particular embodiments and examples, optional features, modification and variation of the concepts herein disclosed may be used by those skilled in the art, and such modifications and variations are considered to be within the scope of the invention as defined by the appended claims.

What is claimed is:

1. A Battery Energy Control Module (BECM) for controlling a battery system for an electric vehicle, comprising:

a relax time look up table (LUT) of battery relaxation time based on predetermined root mean square (RMS) current and temperature of the battery system, wherein the LUT provides a set of relaxation time values corresponding to RMS current and temperature, wherein the BECM 1) monitors key-on power up events and key-off power down events of the vehicle, 2) detects the RMS current and temperature of the battery system when initiating a respective key-off power down event, 3) measures an elapsed time until a respective key-on power up event; 4) identifies a respective relaxation time in the relax time LUT according to the detected RMS current and temperature; and 5) measures an open circuit voltage (OCV) to estimate a state of charge (SOC) of the battery system when initiating the respective key-on power up event if the elapsed time is greater than the identified relaxation time and otherwise waits until the elapsed time from the respective key-off power down event reaches the identified relaxation time to measure the OCV for estimating the SOC of the battery system.

2. The BECM of claim 1, wherein a high-end-value is used as the identified relaxation time when the detected RMS current and temperature values are intermediate between predetermined RMS current and temperature values listed in the relax time LUT.

3. The BECM of claim 1, wherein linear interpolation is used to estimate the identified relaxation time when the detected RMS current and temperature values are intermediate between predetermined RMS current and temperature values listed in the relax time LUT.

4. The BECM of claim 1, wherein nonlinear interpolation is used to estimate relaxation time when the detected RMS current and temperature values are intermediate between predetermined RMS current and temperature values listed in the relax time LUT.

* * * * *